US00RE44590E

(19) United States
(12) Reissued Patent
Do

(10) Patent Number: US RE44,590 E
(45) Date of Reissued Patent: Nov. 12, 2013

(54) CLOCK CONTROL DEVICE FOR TOGGLING AN INTERNAL CLOCK OF A SYNCHRONOUS DRAM FOR REDUCED POWER CONSUMPTION

(75) Inventor: Chang-Ho Do, Ichon-shi (KR)

(73) Assignee: 658868 N.B. Inc., St. John, New Brunswick (CA)

(21) Appl. No.: 13/369,988

(22) Filed: Feb. 9, 2012

Related U.S. Patent Documents

Reissue of:
(64) Patent No.: 7,307,913
Issued: Dec. 11, 2007
Appl. No.: 11/476,597
Filed: Jun. 29, 2006

(30) Foreign Application Priority Data

Sep. 29, 2005 (KR) ..... 10-2005-0091673
Dec. 2, 2005 (KR) ..... 10-2005-0117137

(51) Int. Cl.
*G11C 8/04* (2006.01)
*G11C 8/18* (2006.01)

(52) U.S. Cl.
USPC ..... 365/240; 365/230.03; 365/230.08; 365/203; 365/229; 365/227; 365/233.11; 365/233.12

(58) Field of Classification Search
USPC ..... 365/240, 239, 203, 230.03, 230.08, 365/227, 229, 233.11, 233.12, 233.1
See application file for complete search history.

(56) References Cited

U.S. PATENT DOCUMENTS

| | | | | |
|---|---|---|---|---|
| 5,835,956 | A | 11/1998 | Park et al. | 711/167 |
| 6,101,144 | A | 8/2000 | Jo | 365/229 |
| 6,154,415 | A | 11/2000 | Jeong | 365/233 |
| 6,243,320 | B1 * | 6/2001 | Hamamoto et al. | 365/230.08 |
| 6,330,200 | B2 * | 12/2001 | Ooishi | 365/201 |
| 6,333,892 | B2 * | 12/2001 | Hamamoto et al. | 365/230.08 |
| 6,366,515 | B2 * | 4/2002 | Hidaka | 365/222 |
| 6,552,959 | B2 | 4/2003 | Yamauchi et al. | 365/233 |
| 6,738,309 | B2 | 5/2004 | Benedix et al. | 365/233 |
| 7,102,939 | B2 | 9/2006 | Ko | |
| 7,307,913 | B2 * | 12/2007 | Do | 365/240 |
| 2002/0039326 | A1 | 4/2002 | Kato et al. | 365/233 |
| 2004/0168134 | A1 | 8/2004 | Prasad | 716/1 |
| 2005/0234205 | A1 | 10/2005 | Yamaguchi et al. | 526/242 |
| 2007/0070791 | A1 * | 3/2007 | Do | 365/233 |

FOREIGN PATENT DOCUMENTS

JP 2000-90666 3/2000

* cited by examiner

*Primary Examiner* — Andrew Q Tran
(74) *Attorney, Agent, or Firm* — Harvey Auerback

(57) ABSTRACT

A clock control device includes a set circuit for triggering an input address in response to an internal command signal to output a first address, a shift register including a plurality of flip-flops connected in series wherein some of the flip-flops perform a flip-flop operation of the first address in synchronism with an internal clock to provide a second address and the remaining flip-flops sequentially conduct a flip-flop operation of the second address in synchronism with a synchronous clock to produce an internal address, an active signal generator for outputting an active signal based on state of an active control signal indicating whether or not each bank is activated and a precharge control signal, and a clock generator for generating the synchronous clock depending on the internal clock and the active signal.

23 Claims, 7 Drawing Sheets

CLOCK CONTROL DEVICE FOR TOGGLING AN INTERNAL CLOCK OF A SYNCHRONOUS DRAM FOR REDUCED POWER CONSUMPTION

Matter enclosed in heavy brackets [ ] appears in the original patent but forms no part of this reissue specification; matter printed in italics indicates the additions made by reissue.

FIELD OF THE INVENTION

The present invention relates to a clock control device; and more particularly, to a technology capable of decreasing current consumption by toggling an internal clock in a precharge/standby state of a semiconductor memory.

DESCRIPTION OF RELATED ART

Generally, a semiconductor memory is processed in synchronism with a clock. A need has existed for high speed operational memory to elevate the performance of a memory system. For such high speed operation, attempts have made to reduce the number of external clock oscillations while increasing internal clock transitions. However, current consumption is increased due to clock transitions within the semiconductor memory. Therefore, memory characteristics are needed that enable high speed operation but consume low power.

FIG. 1 is a diagram of a conventional common clock control device configuration.

The common clock control device includes a set circuit 10 and a shift register 20. The set circuit 10 sets an input address Ai depending on a Column Address Strobe (CAS) signal CASP to provide an address AYi. The shift register 20 is provided with a plurality of D flip-flops DFF1 to DFF4 connected in series. The D flip-flops DFF1 to DFF4 sequentially perform a flip-flop operation of the address AYi in synchronism with an internal clock iCLK to output an address AYI_x.

The conventional clock control device as configured above allows a signal input in synchronism with an external clock to be recognized in synchronism with the internal clock iCLK in a semiconductor memory that operates by a low frequency external clock. An interval between an input timing of a signal synchronization with the external clock and a recognition timing of the signal synchronization with the internal clock iCLK is defined as an internal latency.

In particular, in memories such as Double Data Rate Synchronous Dynamic Random Access Memory (DDR3 SD AM), the user can properly program and employ the internal latency depending on a clock period.

As shown in an operational timing chart of FIG. 2, in DDR3 SRAM, a write command WT is input synchronously by the next clock CLK after an active command ACT and then data is input after a certain time delay. After the data input, a write operation is conducted in a core region of an actual DRAM.

In this case, address data corresponding to the internal latency must be fed to recognize address data input upon input of the write command WT at the initial time of write operation in the core region of the actual DRAM.

For this purpose, the address AYi is output by triggering an external input address Ai in response to the CAS signal CASP synchronized with the clock CLK upon input of the write command WT. Next, the D flip-flops DFF1 to DFF4 sequentially conduct a flip-flop operation of the address AYi triggered in synchronism with the internal clock iCLK, thereby outputting the address AYI_x. That is, they sequentially conduct the flip-flop operation of the address AYi according to the CAS signal CASP_WT, enabled synchronously by the clock CLK at which the write operation is done in the core region of the DRAM.

However, the general clock control device as structured above is operated by applying the internal clock iCLK to the D flip-flop DFF constantly, regardless of the current state of the chip. For the above reason, current consumption is increased as the internal clock iCLK is periodically transitioned.

Where only one shift register 20 is operated as shown in FIG. 1, a current consumption amount is slight. However, since the actual DRAM should process plural addresses and command signals simultaneously, there exist a considerable number of circuits of such configuration as depicted in FIG. 1 within the DRAM. Consequently, a drawback of the conventional device is that current consumption increases as the speed of memories.

SUMMARY OF THE INVENTION

It is, therefore, a primary object of the present invention to provide a technology capable of decreasing current consumption by toggling an internal clock in a precharge/standby state by controlling the clock to toggle only in an active state in a semiconductor memory that allows command signals and addresses externally input to be applied to a core after an internal latency.

In accordance with one aspect of the present invention, there is provided a clock control device including: a set circuit for triggering an input address in response to an internal command signal to output a first address; a shift register including a plurality of flip-flops connected in series, wherein some of the flip-flops perform a flip-flop operation of the first address in synchronism with an internal clock to provide a second address and the remaining flip-flops sequentially conduct a flip-flop operation of the second address in synchronism with a synchronous clock to produce an internal address; an active signal generator for outputting an active signal based on state of an active control signal indicating whether or not each bank is activated and a precharge control signal; and a clock generator for generating the synchronous clock depending on the internal clock and the active signal.

In accordance with another aspect of the present invention, there is provided a clock control device including: a set circuit for triggering an input address in response to an internal command signal to output a first address; a shift register including a plurality of flip-flops coupled in series, wherein some of the flip-flops conduct a flip-flop operation of the first address in synchronism with an internal clock to provide a second address and the remaining flip-flops sequentially perform a flip-flop operation of the second address in synchronism with a synchronous clock to produce an inner address; an active signal generator for outputting an active signal based on state of an active control signal indicating whether or not each bank is activated and a precharge control signal; a flip-flop for carrying out a flip-flop operation of the active signal in synchronism with the internal clock to provide a delayed active signal; and a clock generator for generating the synchronous clock depending on the internal clock and the delayed active signal.

BRIEF DESCRIPTION OF THE DRAWINGS

Other objects and features of the present invention will become apparent from the following description of preferred embodiments taken in conjunction with the accompanying drawings, in which.

DETAILED DESCRIPTION OF THE INVENTION

Hereinafter, a preferred embodiment of the present invention will be set forth in detail with reference to the accompanying drawings.

Figure 1:
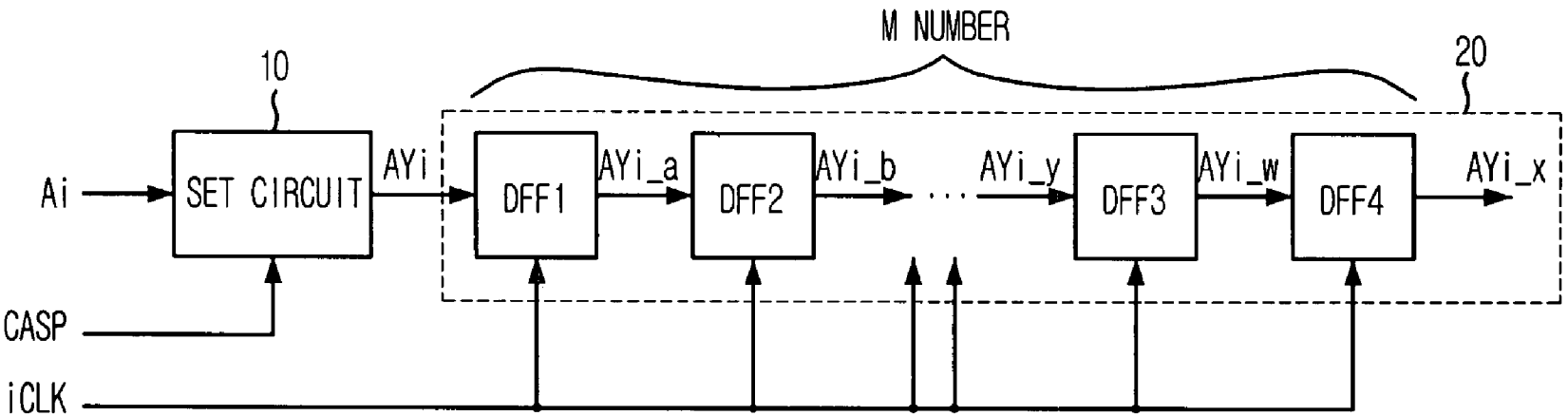
FIG. 1 (RELATED ART)
FIG. 1 is a block diagram of a configuration of a common clock control device.
Figure 2:
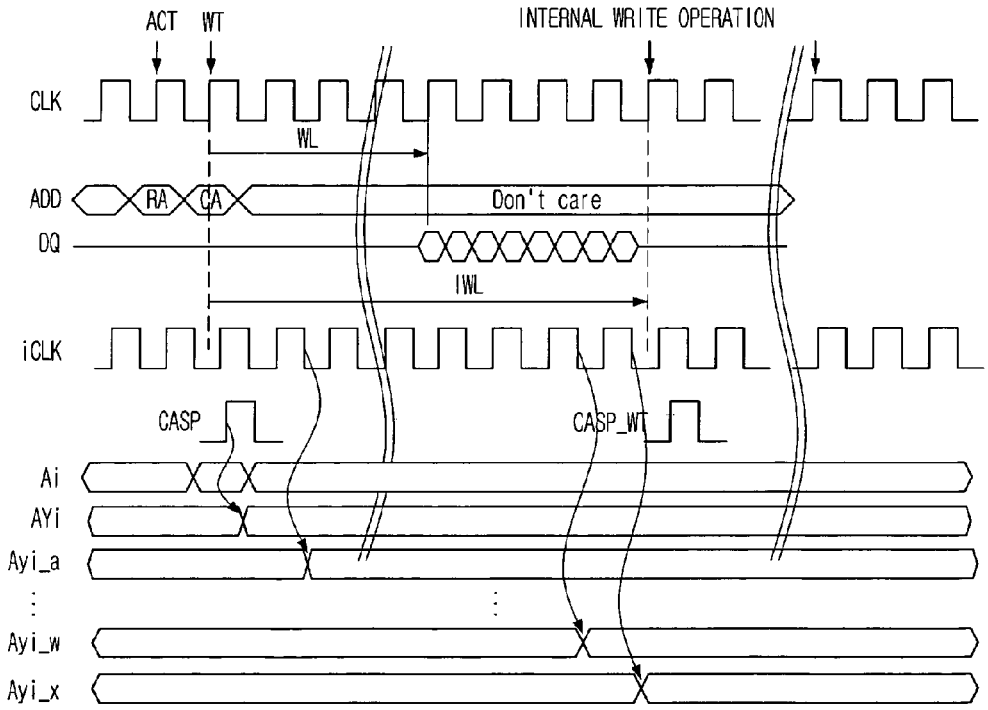
FIG. 2 (RELATED ART)
FIG. 2 is an operational timing diagram of a common clock control device.
Figure 3:
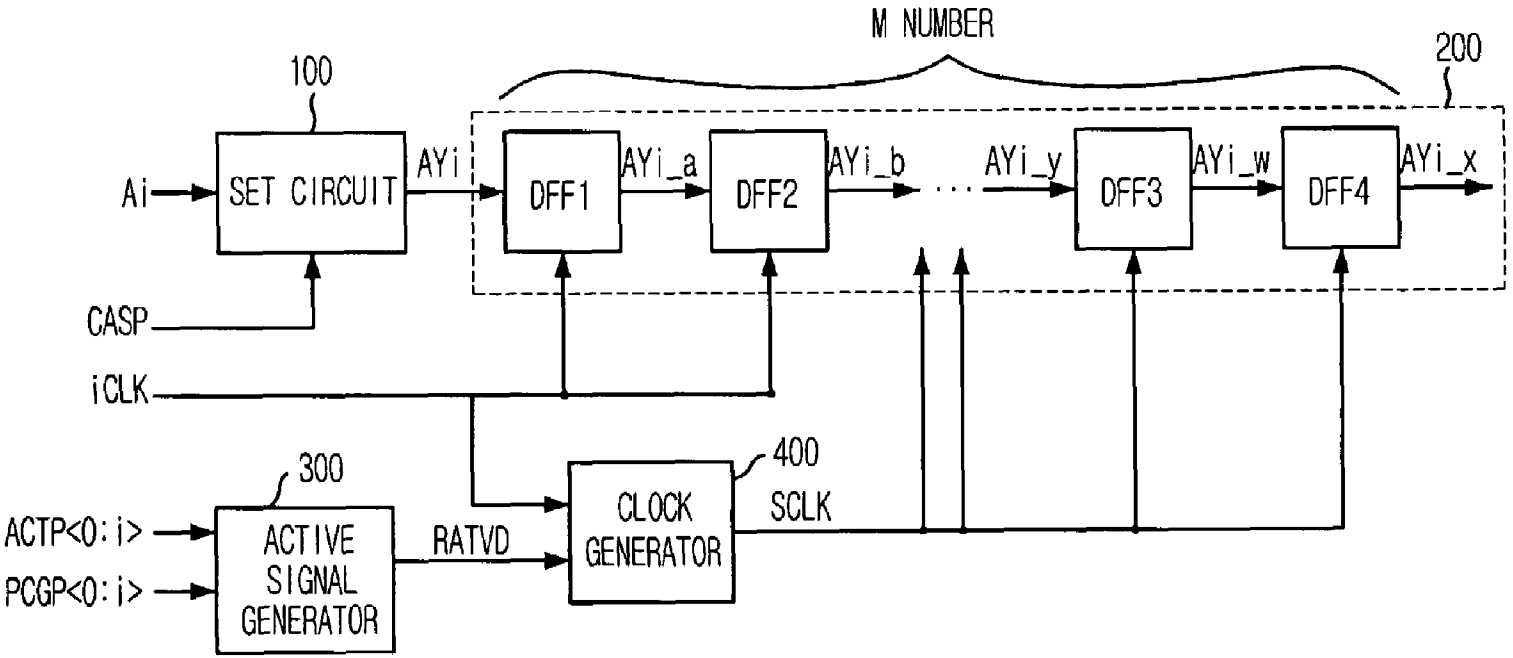
FIG. 3 is a block diagram illustrating a configuration of a clock control device in accordance with an embodiment of the present invention.

FIG. 3 is a block diagram illustrating a configuration of a clock control device in accordance with the present invention.

The clock control device of the invention comprises a set circuit 100, a shift register 200, an active signal generator 300 and a clock generator 400.

Specifically, the set circuit 100 triggers an input address Ai in response to a CAS signal CASP to provide an address AYi. The shift register 200 includes a plurality of D flip-flops DFF1 to DFF4 coupled in series.

Among the plurality of D flip-flops DFF1 to DFF4, the D flip-flop DFF1 conducts a flip-flop operation of the address AYi in synchronism with an internal clock iCLK to output an address Ayi_a. The D flip-flop DFF2 performs a flip-flop operation of an address Ayi_a in synchronism with the internal clock iCLK to provide an address Ayi_b. And the D flip-flops DFF3 and DFF4 carry out a flip-flop operation of the internal address Ayi_b in synchronism with a synchronous clock SCLK to produce an internal address AYI_x.

The active signal generator 300 generates an active signal RATVD based on an active signal ACTP<0:i> and a precharge control signal PCGP<0:i>, in which the active signal indicates that memory is in an active state. The clock generator 400 creates the synchronous clock SCLK depending on the internal clock iCLK and the active signal RATVD.

Figure 4:
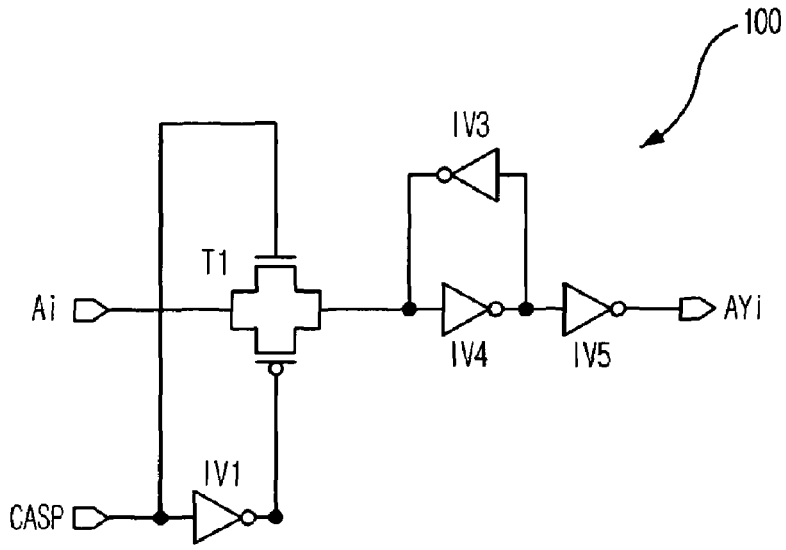
FIG. 4 is a detailed circuit diagram of the set circuit shown in FIG. 3.

FIG. 4 is a detailed circuit diagram of the set circuit 100 shown in FIG. 3.

As provided therein, the set circuit 100 is provided with a transmission gate T1 and a multiplicity of inverters IV1 to IV5. Specifically, the transmission gate T1 serves to selectively output the input address Ai on the basis of the CAS signal CASP and a CAS signal CASP inverted by the inverter IV1. The inverters IV3 and IV4 latch the output signal of the transmission gate T1 for a preset time. The inverter IV5 inverts the output of the latch composed of the inverters IV3 and IV4 to produce an internal address AYi.

Figure 5:
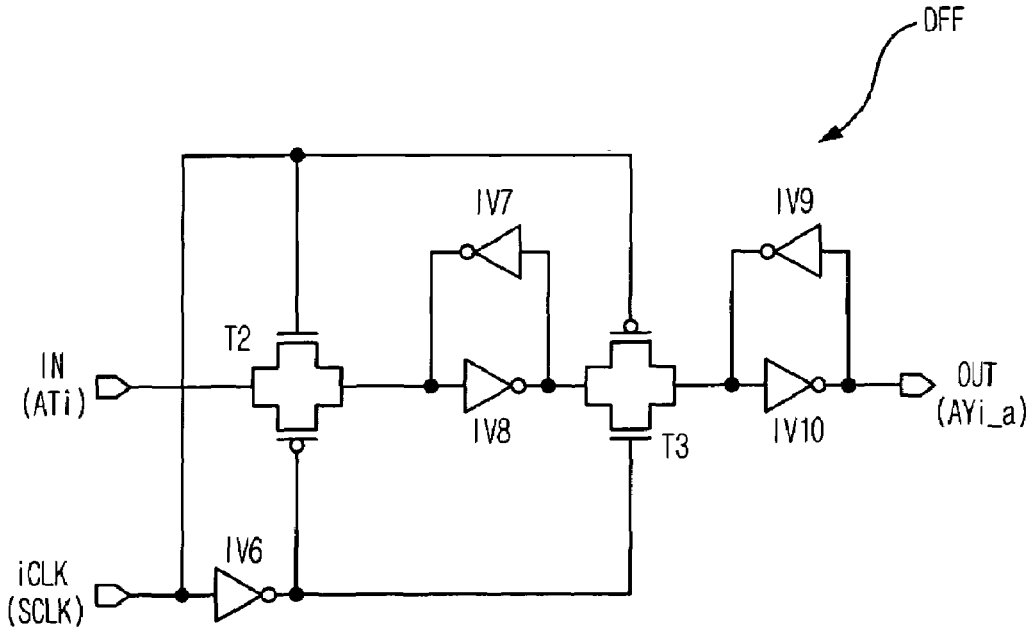
FIG. 5 is a detailed circuit diagram of the shift register shown in FIG. 3.

FIG. 5 presents a detailed circuit diagram of the shift register 200 shown in FIG. 3.

Each D flip-flop DFF includes transmission gates T2 and T3 and plural inverters IV6 to IV10. The transmission gate T2 selectively outputs the internal address AYi in response to the internal clock iCLK and an internal clock iCLK inverted by the inverter IV6. The inverters IV7 and IV8 latch the output signal of the transmission gate T2 for a predetermined time.

The transmission gate T3 is operated contemporarily with the transmission gate T2 based on the internal clock iCLK and the internal clock iCLK inverted by the inverter IV6 to selectively control the output of the latch composed of the inverters IV7 and IV8. A latch, composed of the inverters IV9 and IV10, latches the output of the transmission gate T3 to provide an output signal OUT.

Figure 6:
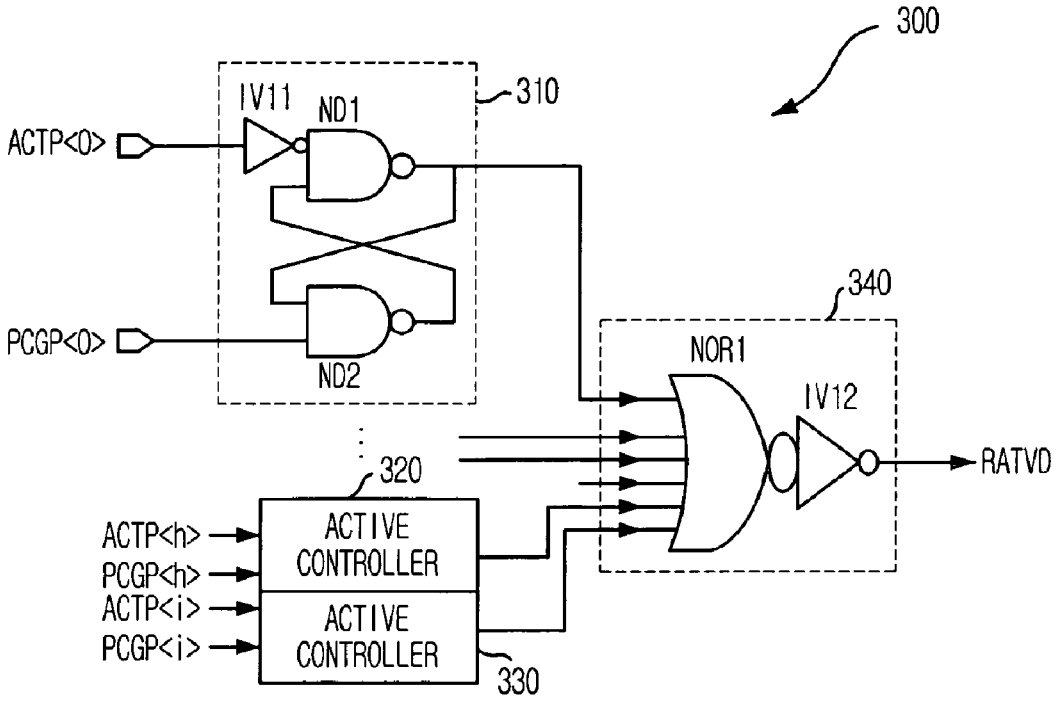
FIG. 6 is a detailed circuit diagram of the active signal generator depicted in FIG. 3.

FIG. 6 provides a detailed circuit diagram of the active signal generator 300 depicted in FIG. 3.

The active signal generator 300 includes a plurality of active controllers 310 to 330 and a logical operator 340. Each of the active controllers 310 to 330 logically operates an active control signal ACTP<0:i> and a precharge control signal PCGP<0:i>, respectively. The plurality of active controllers 310 to 330 has the same configuration; and thus, only a controller 310 will be described below in detail.

As shown in FIG. 6, the active controller 310 is provided with an inverter IV11 and NAND gates ND1 and ND2. The NAND gate ND1 does a NAND operation of an active control signal ACTP<0> inverted by the inverter IV11 and an output of the NAND gate ND1. NAND gate ND2 performs a NAND operation of the precharge control signal PCGP<0> and the output of the NAND gate ND1.

The logical operator 340 includes a NOR gate NOR1 and an inverter IV12. The NOR gate NOR1 NOR-operates the outputs of the plurality of active controllers 310 to 330. The inverter IV12 inverts the output of the NOR gate NOR1 to produce an active signal RATVD.

Figure 7:
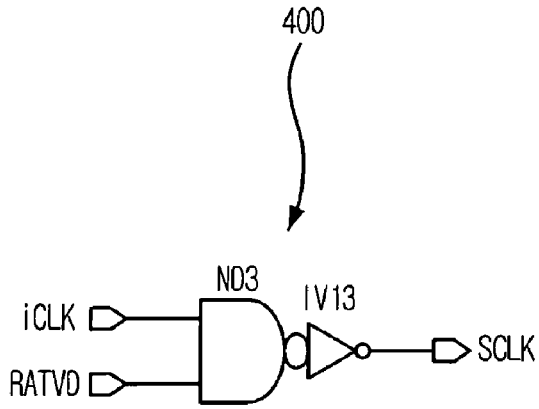
FIG. 7 is a detailed circuit diagram of the clock generator shown in FIG. 3.

FIG. 7 is a detailed circuit diagram of the clock generator 400 shown in FIG. 3.

As shown therein, the clock generator 400 is equipped with a NAND gate ND3 and an inverter IV13. The NAND gate ND3 acts a NAND operation of the internal clock iCLK and the active signal RATVD. The inverter IV13 inverts the output of the NAND gate ND3 to provide the synchronous clock SCLK.

Figure 8:
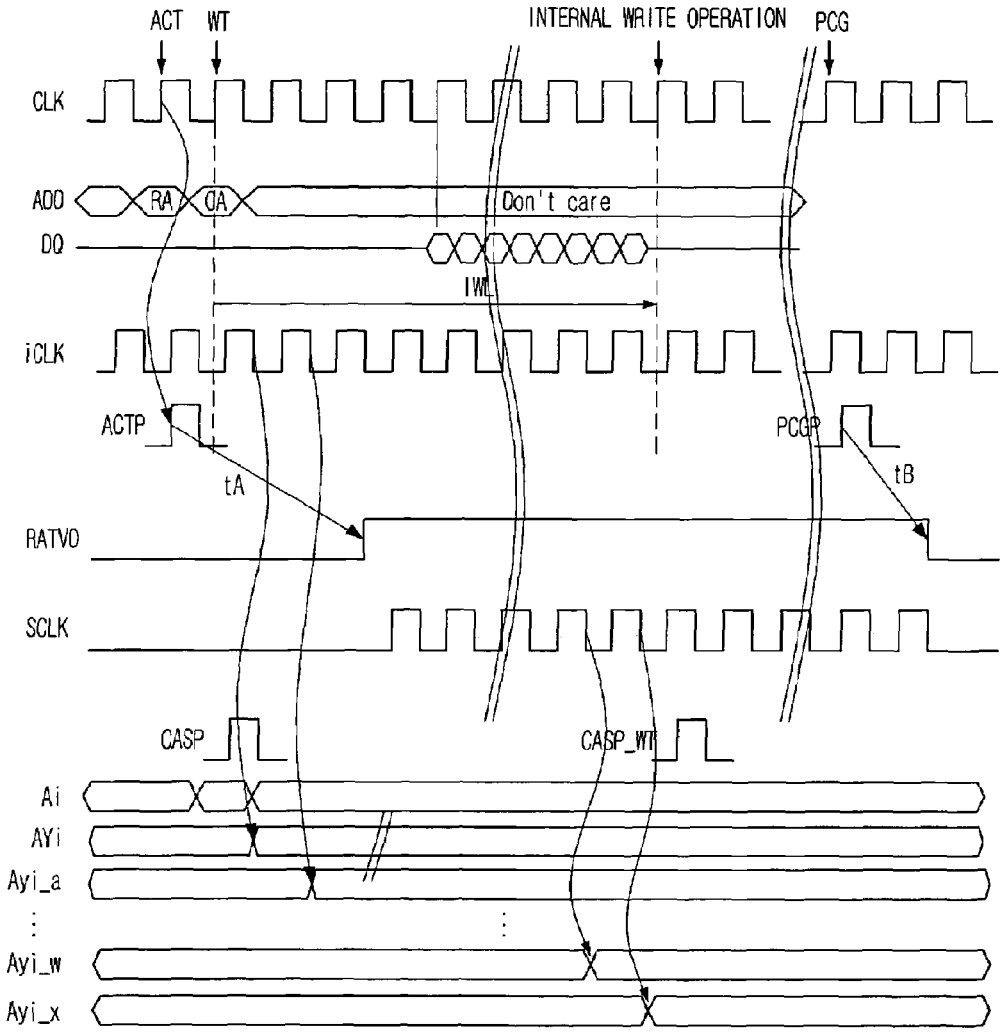
FIG. 8 is an operational timing diagram of the clock generator in accordance with the embodiment of the present invention.

Operation of the invention as configured above will be explained in detail referring to FIGS. 3 to 7 in parallel with an operational timing diagram shown in FIG. 8.

First, the set circuit 100 latches the input address Ai input synchronously by a clock signal CLK upon activation of the CAS signal CASP to output the address AYi. The external input address Ai is sensed by the CAS signal CASP created by an internal command signal, write or read command.

Next, the shift register 200 conducts a flip-flop operation of the address AYi in synchronism with the internal clock iCLK to output the internal address Ayi_b and sequentially acts a flip-flop operation of the address Ayi_b in synchronism with the synchronous clock SCLK to provide the internal address AYI_x.

In a multiple bank DRAM, an active operation may be done for each bank. Therefore, the active signal generator 300 is provided with the plurality of active controllers 310 to 330 for controlling active status data of each of the banks.

This active signal generator 300 logically operates each of the active signal ACTP<0:i> and the precharge control signal PCGP<0:i> to provide the active signal RATVD indicating that memory is in an active state. Therefore, the active signal RATVD is of logic low if all the banks are in a precharge state and is activated to logic high if any one of them is in an active state.

Next, the clock generator 400 generates the synchronous clock SCLK based on the clock signal RATVD and the internal clock iCLK. In other words, if the active signal RATVD is in an activation state, the synchronous clock SCLK is output synchronously by the internal clock iCLK.

This invention controls the operation of the shift register 200 depending on both of the internal clock iCLK and the synchronous clock SCLK. That is, the active signal RATVD is activated by the active control signal ACTP denoting the external active command. Therefore, upon high speed operation, an internal delay time from a clock CLK at which the active control signal ACTP is input extends to a prolonged clock tA.

Accordingly, to decrease current consumption, the synchronous clock SCLK that is operated only when chip is in an active state is generated only after that time. If all the D flip-flops DFF1 to DFF4 of the shift register 200 are controlled by synchronizing with the synchronous clock SCLK, the first D flip-flop DFF1 senses the internal address AYi that is the output of the set circuit 100 by the synchronous clock SCLK generated after the delayed time tA. In this case, the transfer of valid information becomes substantially slower than a time at which it should be resynchronized, thereby causing a malfunctioning.

Therefore, the invention controls the operation of the shift register 200 by separating the internal clock iCLK and the synchronous clock SCLK in order to assure the high speed operation. At this time, the delayed time tA is varied relying upon Process, Voltage and Temperature (PVT); and thus, the internal clock iCLK and the synchronous clock SCLK are distributed by considering circumstances by which the synchronous clock SCLK is produced after the delayed time.

As a result, the invention properly can properly control a clock excessively operated in the precharge state during the high speed operation, thereby decreasing current consumption (in SDRAM, average current consumption is defined by IDD2N) in the precharge state.

Figure 9:
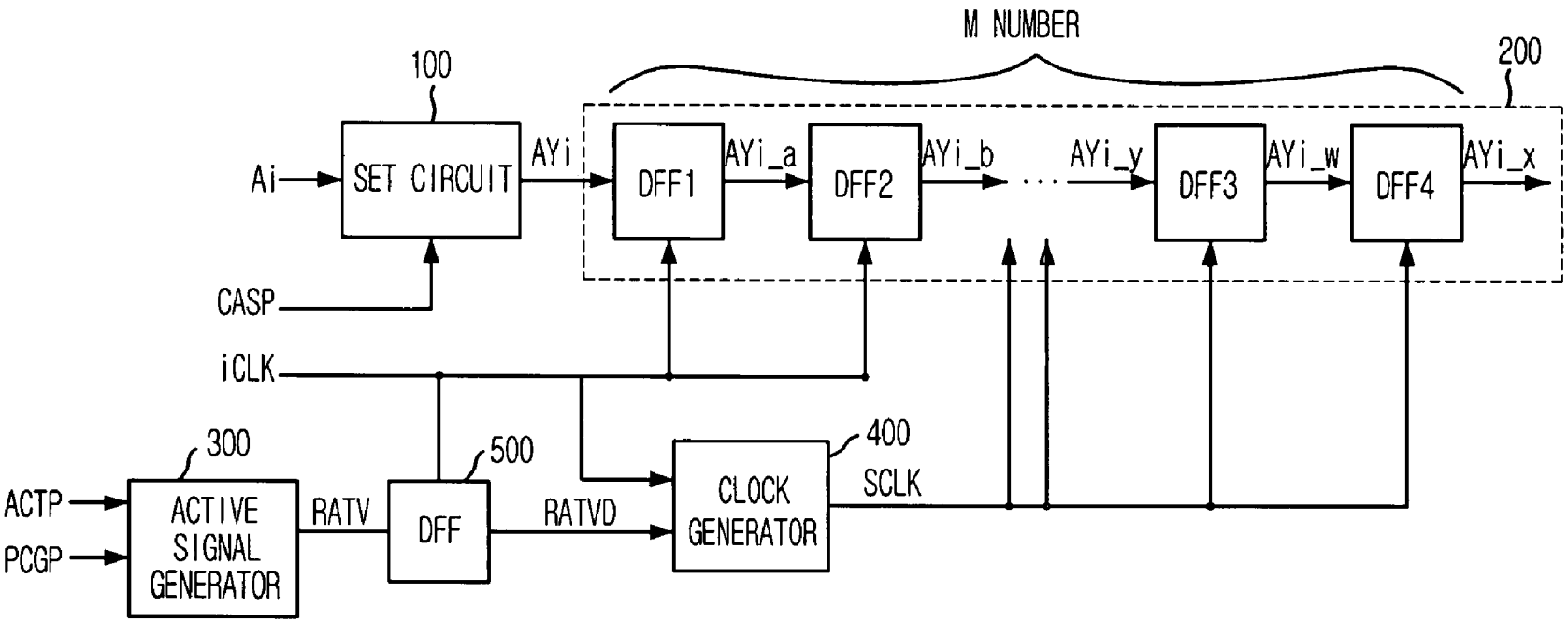
FIG. 9 is a block diagram of a clock control device in accordance with another embodiment of the invention.

FIG. 9 is a block diagram of a clock control device in accordance with another embodiment of the invention.

The embodiment of FIG. 9 comprises a set circuit 100, a shift register 200, an active signal generator 300, a clock generator 400 and a D flip-flop 500.

The embodiment of FIG. 9 as structured above further comprises a D flip-flop 500, compared to the structure of FIG. 3. The D flip-flop 500 performs a flip-flop operation of the active signal RATVD output from the active signal generator 300 to provide a delayed active signal RATVD. By doing so, the synchronous clock SCLK can be created more stably by allowing the active signal RATVD applied to the clock generator 400 to be synchronized at a falling edge of the internal clock iCLK.

In other words, where the active signal RATVD is synchronized with the internal clock iCLK, the active signal RATVD is a signal delayed by the internal delay and the internal clock iCLK is an internal clock signal interworking depending on an external clock. Therefore, there may be a state where the internal clock iCLK becomes logic high at the time when the active signal RATVD is activated to logic high. In this case, the synchronous clock SCLK may be created as a glitch signal with incomplete pulse width.

Accordingly, the embodiment of FIG. 9 can prevent the malfunctioning by the synchronous clock with glitch component by separating the D flip-flop 500 synchronized with the internal clock iCLK from the D flip-flop DFF of the shift register 200 synchronized with the synchronous clock SCLK.

Although there is described with respect to the address Ai as the input signal in the embodiments of the invention, it should be noted that the input signal may be address, control signal, or data in the invention, without limiting thereto.

As explained above, the invention can decrease current consumption by toggling of an internal clock in a precharge/standby state by toggling it only in an active state in a semiconductor memory that allows command signals and addresses inputted from outside to be applied to a core after an internal latency.

The present application contains subject matter related to Korean patent application No. 2005-91673 and No. 2005-117137, filed with the Korean Intellectual Property Office on Sep. 29, 2005 and on Dec. 02, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A clock control device, comprising:

a set circuit for triggering an input address in response to an internal command signal to output a first address;

a shift register including a plurality of flip-flops connected in series, wherein some of the flip-flops perform a flip-flop operation of the first address in synchronism with an internal clock to provide a second address and the remaining flip-flops sequentially conduct a flip-flop operation of the second address in synchronism with a synchronous clock to produce an internal address;

an active signal generator for outputting an active signal, based on [an] *a plurality of* active control [signal] *signals* indicating whether or not [each] *a corresponding* bank of a plurality of memory banks is activated, and a *plurality of* precharge control [signal] *signals indicating whether or not a corresponding bank of the plurality of memory banks is precharged*; and a clock generator for generating the synchronous clock depending on the internal clock and the active signal.

2. The clock control device as recited in claim 1, wherein the set circuit includes:

a first transmission gate for selectively outputting the input address based on an activation state of the internal command signal;

a latch for latching the output of the first transmission gate; and a first inverter for inverting the output of the latch to provide the first address.

3. The clock control device as recited in claim 1, wherein the plurality of flip-flops are D flip-flops.

4. The clock control device as recited in claim 1, wherein the active signal generator outputs the active signal of logic low if the plurality of memory banks are all in a precharge state and the active signal of logic high if at least one of the plurality of memory banks is in an active state.

5. The clock control device as recited in claim 4, wherein the active signal generator includes:

a plurality of active controllers for logically combining [the] *respective* active control [signal] *signals* with [the] *respective* precharge control [signal] *signals*; and a logical operator for logically operating the outputs of the plurality of active controllers to provide the active signal.

6. The clock control device as recited in claim 5, wherein the number of active controllers corresponds to the number of the memory banks.

7. The clock control device as recited in claim 5, wherein each of the plurality of active controllers includes:

a second inverter for inverting [the] *a respective* active control signal;

a first NAND gate for carrying out a NAND operation of the output of the second inverter and a first signal to output a second signal; and a second NAND gate for acting a NAND operation of [the] *a respective* precharge control signal and the second signal to produce the first signal.

8. The clock control device as recited in claim 5, wherein the logical operator includes:

a NOR gate for NOR-operating the outputs of the plurality of active controllers; and a third inverter for inverting the output of the NOR gate to output the active signal.

9. The clock control device as recited in claim 1, wherein the clock generator outputs the synchronous clock in synchronism with the internal clock if the active signal is in an activation state.

10. The clock control device as recited in claim 9, wherein the clock generator includes:

a third NAND gate for NAND-operating the internal clock and the active signal; and a fourth inverter for inverting the output of the third NAND gate to output the synchronous clock.

11. A clock control device comprising:

a set circuit for triggering an input address in response to an internal command signal to output a first address;

a shift register including a plurality of flip-flops coupled in series, wherein some of the flip-flops conduct a flip-flop operation of the first address in synchronism with an internal clock to provide a second address and the remaining flip-flops sequentially perform a flip-flop operation of the second address in synchronism with a synchronous clock to produce an inner address;

an active signal generator for outputting an active signal, based on [an] *a plurality of* active control [signal] *signals* indicating whether or not [each memory] *a corresponding* bank *of a plurality of memory banks* is activated and a *plurality of* precharge control [signal] *signals indicating whether or not a corresponding bank of the plurality of memory banks is precharged*;

a flip-flop for carrying out a flip-flop operation of the active signal in synchronism with the internal clock to provide a delayed active signal; and a clock generator for generating the synchronous clock depending on the internal clock and the delayed active signal.

12. The clock control device as recited in claim 11, wherein the flip-flop is a D flip-flop.

13. A clock control device, comprising:

a set circuit for triggering an input address in response to an internal command signal to output a first address;

a shift register including a plurality of flip-flops connected in series and configured to generate an internal address in response to an internal clock and a synchronous clock;

an active signal generator for outputting an active signal, based on [an] *a plurality of* active control [signal] *signals* indicating whether or not [each] *a corresponding* bank of a plurality of memory banks is activated, and a *plurality of* precharge control [signal] *signals indicating whether or not a corresponding bank of the plurality of memory banks is precharged*; and a clock generator for generating the synchronous clock depending on the internal clock and the active signal.

14. The clock control device as recited in claim 13, wherein some of the flip-flops in the shift register perform a flip-flop operation of the first address in synchronism with the internal clock to provide a second address and the remaining flip-flops sequentially conduct a flip-flop operation of the second address in synchronism with the synchronous clock to produce the internal address.

15. The clock control device as recited in claim 14, wherein the set circuit includes:

a first transmission gate for selectively outputting the input address based on an activation state of the internal command signal;

a latch for latching the output of the first transmission gate; and a first inverter for inverting the output of the latch to provide the first address.

16. The clock control device as recited in claim 14, wherein the plurality of flip-flops are D flip-flops.

17. The clock control device as recited in claim 14, wherein the active signal generator outputs the active signal of logic low if the plurality of memory banks are all in a precharge state and the active signal of logic high if at least one of the plurality of memory banks is in an active state.

18. The clock control device as recited in claim 17, wherein the active signal generator includes:

a plurality of active controllers for logically combining [the] *respective* active control [signal] *signals* with [the] *respective* precharge control [signal] *signals*; and a logical operator for logically operating the outputs of the plurality of active controllers to provide the active signal.

19. The clock control device as recited in claim 18, wherein the number of active controllers corresponds to the number of the memory banks.

20. The clock control device as recited in claim 18, wherein each of the plurality of active controllers includes:

a second inverter for inverting [the] *a respective* active control signal;

a first NAND gate for carrying out a NAND operation of the output of the second inverter and a first signal to output a second signal; and a second NAND gate for acting a NAND operation of [the] *a respective* precharge control signal and the second signal to produce the first signal.

21. The clock control device as recited in claim 18, wherein the logical operator includes:

a NOR gate for NOR-operating the outputs of the plurality of active controllers; and a third inverter for inverting the output of the NOR gate to output the active signal.

22. The clock control device as recited in claim 14, wherein the clock generator outputs the synchronous clock in synchronism with the internal clock if the active signal is in an activation state.

23. The clock control device as recited in claim 22, wherein the clock generator includes:

a third NAND gate for NAND-operating the internal clock and the active signal; and a fourth inverter for inverting the output of the third NAND gate to output the synchronous clock.

* * * * *